(12) United States Patent
Liang et al.

(10) Patent No.: US 11,374,303 B2
(45) Date of Patent: Jun. 28, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Fang-Yu Liang, Taipei (TW); Chih-Chiang Tsao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 469 days.

(21) Appl. No.: 16/367,268

(22) Filed: Mar. 28, 2019

(65) Prior Publication Data

US 2020/0313278 A1    Oct. 1, 2020

(51) Int. Cl.
*H01Q 1/22* (2006.01)
*H01Q 1/24* (2006.01)
*H01L 23/00* (2006.01)
*H01L 23/66* (2006.01)

(52) U.S. Cl.
CPC .......... *H01Q 1/2283* (2013.01); *H01L 23/66* (2013.01); *H01L 24/24* (2013.01); *H01L 24/82* (2013.01); *H01Q 1/243* (2013.01); *H01L 24/13* (2013.01); *H01L 2223/6677* (2013.01); *H01L 2224/13024* (2013.01); *H01L 2224/24101* (2013.01); *H01L 2224/24227* (2013.01); *H01L 2224/25171* (2013.01); *H01L 2224/82005* (2013.01)

(58) Field of Classification Search
CPC ...... H01Q 1/2283; H01Q 1/243; H01L 23/66; H01L 24/24; H01L 24/82; H01L 24/13; H01L 2223/6677; H01L 2224/13024; H01L 2224/24101; H01L 2224/24227; H01L 2224/25171; H01L 2224/82005; H01L 24/32; H01L 24/73; H01L 24/92; H01L 2224/04105; H01L 2224/12105; H01L 2224/32225; H01L 2224/97; H01L 24/19; H01L 2224/73267; H01L 2224/92244

See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |

(Continued)

*Primary Examiner* — Hai V Tran
*Assistant Examiner* — Michael M Bouizza
(74) *Attorney, Agent, or Firm* — JCIPRNET

(57) ABSTRACT

A package structure includes a semiconductor die, an insulating encapsulant, a redistribution layer and a plurality of antenna patterns. The semiconductor die has an active surface and a backside surface opposite to the active surface. The insulating encapsulant is encapsulating the semiconductor die. The redistribution layer is located on the active surface of the semiconductor die and over the insulating encapsulant. The plurality of antenna patterns is located over the semiconductor die, wherein the plurality of antenna patterns comprises a plurality of trenches located on a surface of the plurality of antenna patterns.

20 Claims, 21 Drawing Sheets

(56) References Cited

U.S. PATENT DOCUMENTS

| | | |
|---|---|---|
| 9,372,206 B2 | 6/2016 | Wu et al. |
| 9,496,189 B2 | 11/2016 | Yu et al. |
| 2019/0081412 A1* | 3/2019 | Hugel .................. H01Q 21/064 |
| 2019/0173195 A1* | 6/2019 | Kim ..................... H01Q 1/2283 |
| 2020/0251414 A1* | 8/2020 | Hsu ..................... H01L 21/4871 |

* cited by examiner

PACKAGE STRUCTURE AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
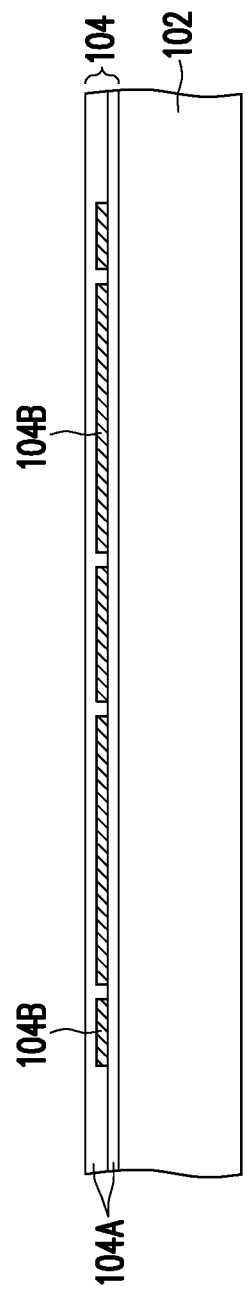
FIG. 1A to FIG. 1H are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic sectional views of various stages in a method of fabricating a package structure according to some exemplary embodiments of the present disclosure. Referring to FIG. 1A, in some embodiments, a carrier 102 is provided. In some embodiments, the carrier 102 may be a glass carrier or any suitable carrier for carrying a semiconductor wafer or a reconstituted wafer for the manufacturing method of the package structure. In some embodiments, the carrier 102 is coated with a debond layer (not shown). The material of the debond layer may be any material suitable for bonding and de-bonding the carrier 102 from the above layer(s) or any wafer(s) disposed thereon.

In some embodiments, the debond layer may include a dielectric material layer made of a dielectric material including any suitable polymer-based dielectric material (such as benzocyclobutene ("BCB"), polybenzoxazole ("PBO")). In an alternative embodiment, the debond layer may include a dielectric material layer made of an epoxy-based thermal-release material, which loses its adhesive property when heated, such as a light-to-heat-conversion (LTHC) release coating film. In a further alternative embodiment, the debond layer may include a dielectric material layer made of an ultra-violet (UV) glue, which loses its adhesive property when exposed to UV lights. In certain embodiments, the debond layer may be dispensed as a liquid and cured, or may be a laminate film laminated onto the carrier 102, or may be the like. The top surface of the debond layer, which is opposite to a bottom surface contacting the carrier 102, may be leveled and may have a high degree of coplanarity. In certain embodiments, the debond layer is, for example, a LTHC layer with good chemical resistance, and such layer enables room temperature de-bonding from the carrier 102 by applying laser irradiation, however the disclosure is not limited thereto.

Furthermore, as illustrated in FIG. 1A, a redistribution layer 104 (backside redistribution layer) is formed over the carrier 102. For example, the redistribution layer 104 may be formed on the debond layer, and the formation of the redistribution layer 104 includes sequentially forming one or more dielectric layers 104A and one or more conductive layers 104B in alternation. In some embodiments, the redistribution layer 104 includes two dielectric layers 104A and one conductive layer 104B as shown in FIG. 1A, where the conductive layer 104B is sandwiched between the dielectric layers 104A. However, the disclosure is not limited thereto. The numbers of the dielectric layers 104A and the conductive layer 104B included in the redistribution layer 104 is not limited thereto, and may be designated and selected based on the demand. For example, the numbers of the dielectric layers 104A and the conductive layers 104B may be one or more than one.

In some embodiments, the dielectric layers 104A may include materials such as polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 104A may be formed by suitable fabrication techniques such as spin-on coating, chemical vapor deposition (CVD), plasma-enhanced chemical vapor deposition (PECVD) or the like. The disclosure is not limited thereto.

In certain embodiments, the conductive layer 104B may include conductive materials formed by electroplating or deposition, such as aluminum, titanium, copper, nickel, tungsten, and/or alloys thereof, which may be patterned using a photolithography and etching process. In some embodiments, the conductive layer 104B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1B:
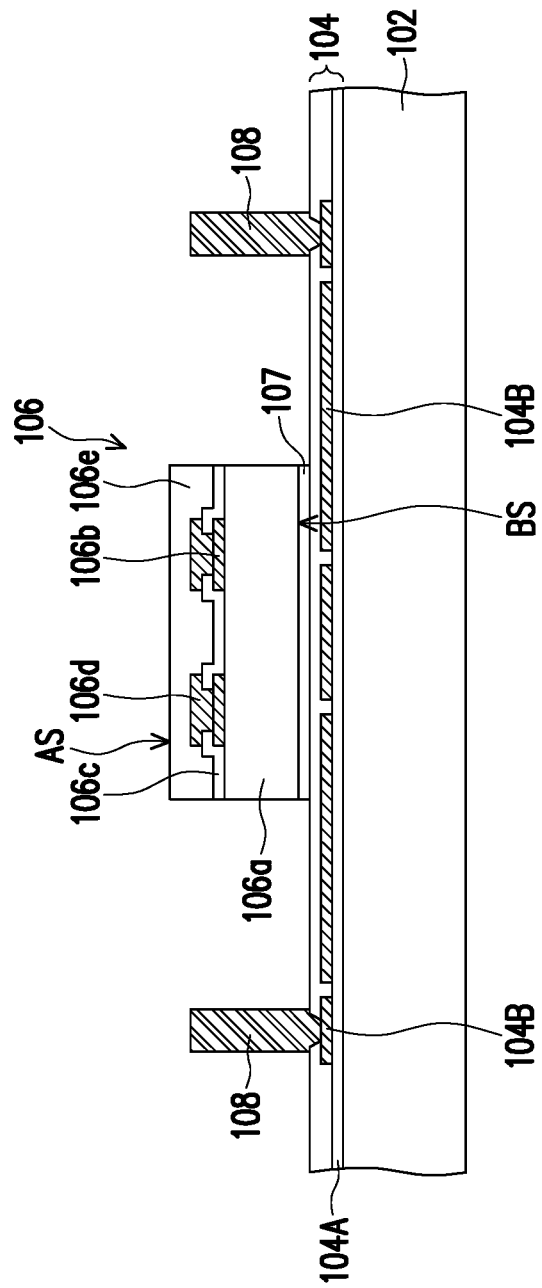

Referring to FIG. 1B, after forming the redistribution layer 104, at least one semiconductor die 106 and a plurality of through insulator vias 108 are provided on the redistribution layer 104 and over the carrier 102. In some embodiments, the through insulator vias 108 are through integrated fan-out ("InFO") vias. In one embodiment, the formation of the through insulator vias 108 includes forming a mask pattern (not shown) with openings, then forming a metallic material (not shown) filling up the openings by electroplating or deposition, and removing the mask pattern to form the through insulator vias 108 on the redistribution layer 104. In certain embodiments, the through insulator vias 108 fills into a via opening that reveals the conductive layer 104B of the redistribution layer 104, so that the through insulator vias 108 may be electrically connected to the redistribution layer 104. In some embodiments, the material of the mask pattern may include a positive photo-resist or a negative photo-resist. In one embodiment, the material of the through insulator vias 108 may include a metal material such as copper or copper alloys, or the like. However, the disclosure is not limited thereto.

In an alternative embodiment, the through insulator vias 108 may be formed by forming a seed layer (not shown) on the redistribution layer 104; forming the mask pattern with openings exposing portions of the seed layer; forming the metallic material on the exposed portions of the seed layer to form the through insulator vias 108 by plating; removing the mask pattern; and then removing portions of the seed layer exposed by the through insulator vias 108. For example, the seed layer may be a titanium/copper composited layer. For simplification, only two through insulator vias 108 are illustrated in FIG. 1B. However, it should be noted that the number of through insulator vias 108 is not limited thereto, and can be selected based on requirement. Furthermore, in some embodiments, at least one dipole antenna (not shown) may be formed during the formation of the through insulator vias 108. For example, the dipole antenna may be disposed on the redistribution layer 104 and be adjacent to the through insulator vias 108.

As illustrated in FIG. 1B, at least one semiconductor die 106 is picked and placed on the redistribution layer 104. In certain embodiments, the semiconductor die 106 has an active surface AS, and a backside surface BS opposite to the active surface AS. For example, the backside surface BS of the semiconductor die 106 may be attached to the redistribution layer 104 through a die attach film 107. By using the die attach film 107, a better adhesion between the semiconductor die 106 and the redistribution layer 104 is ensured. In the exemplary embodiment, only one semiconductor die 106 is illustrated. However, it should be noted that the number of semiconductor dies placed on the redistribution layer 104 is not limited thereto, and this can be adjusted based on design requirement.

In some embodiments, the semiconductor die 106 includes a semiconductor substrate 106a, a plurality of conductive pads 106b, a passivation layer 106c, a plurality of conductive posts 106d, and a protection layer 106e. As illustrated in FIG. 1B, the plurality of conductive pads 106b is disposed on the semiconductor substrate 106a. The passivation layer 106c is formed over the semiconductor substrate 106a and has openings that partially expose the conductive pads 106b on the semiconductor substrate 106a. The semiconductor substrate 106a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106b may be aluminum pads, copper pads or other suitable metal pads. The passivation layer 106c may be a silicon oxide layer, a silicon nitride layer, a silicon oxynitride layer or a dielectric layer formed of any suitable dielectric materials. Furthermore, in some embodiments, a post-passivation layer (not shown) is optionally formed over the passivation layer 106c. The post-passivation layer covers the passivation layer 106c and has a plurality of contact openings. The conductive pads 106b are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106d are formed on the conductive pads 106b by plating. In some embodiments, the protection layer 106e is formed on the passivation layer 106c or on the post passivation layer, and covering the conductive posts 106d so as to protect the conductive posts 106d.

In some embodiments, when more than one semiconductor die 106 are placed on the redistribution layer 104, the semiconductor dies 106 may be arranged in an array, and when the semiconductor dies 106 are arranged in an array, the through insulator vias 108 may be classified into groups. The number of the semiconductor dies 106 may correspond to the number of groups of the through insulator vias 108. In the exemplary embodiment, the semiconductor die 106 may be picked and placed on the redistribution layer 104 after the formation of the through insulator vias 108. However, the disclosure is not limited thereto. In some alternative embodiments, the semiconductor die 106 may be picked and placed on the redistribution layer 104 before the formation of the through insulator vias 108.

In some exemplary embodiments, the semiconductor die 106 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1C:
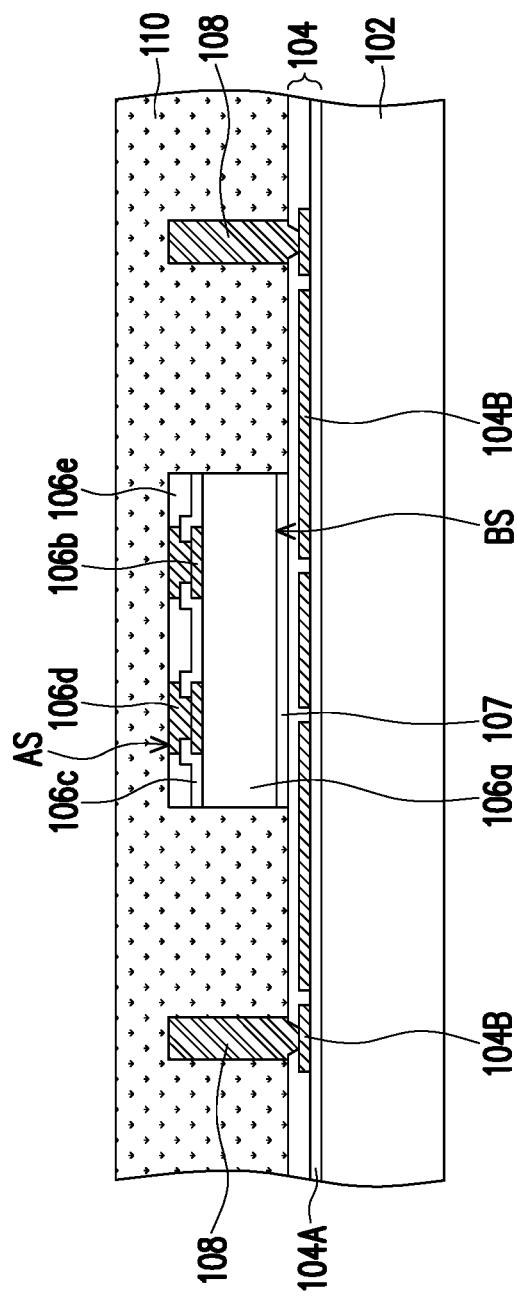

Referring to FIG. 1C, in some embodiments, an insulating material 110 is formed on the redistribution layer 104 and over the semiconductor die 106. In some embodiments, the insulating material 110 is formed through, for example, a compression molding process, filling up the gaps between the semiconductor die 106 and the through insulating vias 108 to encapsulate the semiconductor die 106. The insulating material 110 also fills up the gaps between adjacent through insulator vias 108 (if any) to encapsulate the through insulator vias 108. At this stage, the conductive posts 106d and the protection layer 106e of the semiconductor die 106 are encapsulated by and well protected by the insulating material 110. In other words, the conductive posts 106d and the protection layer 106e of the semiconductor die 106 are not revealed and are well protected by the insulating material 110.

In some embodiments, the insulating material 110 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 110 may include an acceptable insulating encapsulation material. In some embodiments, the insulating material 110 may further include inorganic filler or inorganic compound (e.g. silica, clay, and so on) which can be added therein to optimize coefficient of thermal expansion (CTE) of the insulating material 110. The disclosure is not limited thereto.

Figure 1D:
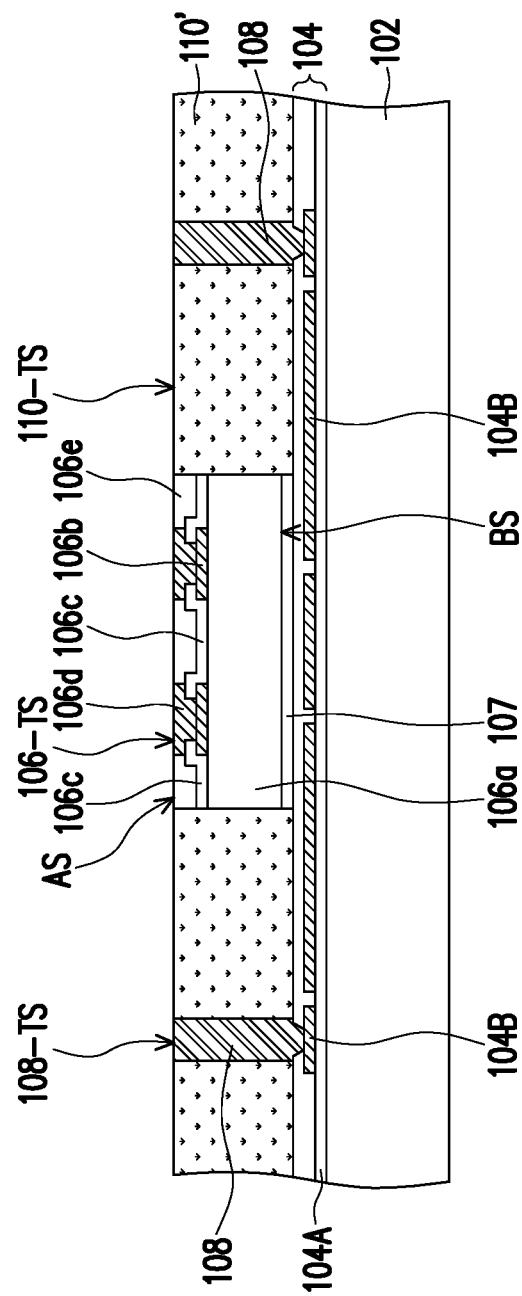

Referring to FIG. 1D, in a next step, the insulating material 110 is partially removed to expose the conductive posts 106d and the through insulator vias 108. In some embodiments, the insulating material 110 and the protection layer 106e are ground or polished by a planarization step. For example, the planarization step is performed through a mechanical grinding process and/or a chemical mechanical polishing (CMP) process until the top surfaces 106-TS of the conductive posts 106d are revealed. In some embodiments, the through insulator vias 108 may be partially polished so that the top surfaces 108-TS of the through insulator vias 108 are levelled with the top surfaces 106-TS of the conductive posts 106d, or levelled with the active surface AS of the semiconductor die 106. In other words, the conductive posts 106d and the through insulator vias 108 may also be slightly grinded/polished.

In the illustrated embodiment, the insulating material 110 is polished to form an insulating encapsulant 110'. In some embodiments, the top surface 110-TS of the insulating encapsulant 110', the top surface 108-TS of the through insulator vias 108, the top surface 106-TS of the conductive posts 106d, and the top surface of the polished protection layer 106e are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1E:
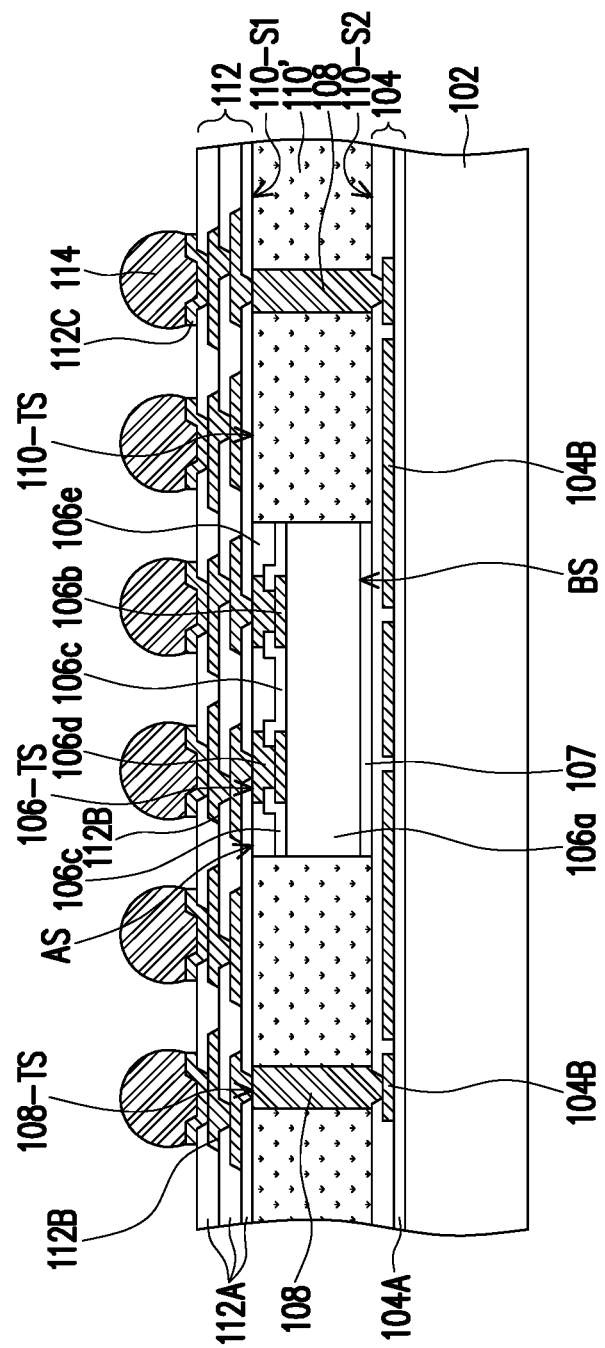

Referring to FIG. 1E, after the planarization step, a redistribution layer 112 (top redistribution layer) is formed on the insulating encapsulant 110', the through insulator vias 108, and over the semiconductor die 106. For example, the redistribution layer 112 is formed on the top surface 108-TS of the through insulator vias 108, on the top surface 106-TS of the conductive posts 106d, and on the top surface 110-TS of the insulating encapsulant 110'. In some embodiments, the redistribution layer 112 is electrically connected to the through insulator vias 108, and is electrically connected to the semiconductor die 106 through the conductive posts 106d. In some embodiments, the semiconductor die 106 is electrically connected to the through insulator vias 108 through the redistribution layer 112. In the illustrated embodiment, the insulating encapsulant 110' has a first surface 110-S1 and a second surface 110-S2, wherein the second surface 110-S2 is opposite to the first surface 110-S1. In certain embodiments, the redistribution layer 104 (backside redistribution layer) is located on the second surface 110-S2 of the insulating encapsulant 110', whereas the redistribution layer 112 (top redistribution layer) is located on the first surface 110-S1 of the insulating encapsulant 110'.

In some embodiments, the formation of the redistribution layer 112 includes sequentially forming one or more dielectric layers 112A, and one or more conductive layers 112B in alternation. In certain embodiments, the conductive layers 112B are sandwiched between the dielectric layers 112A. Although only two layers of the conductive layers 112B and three layers of dielectric layers 112A are illustrated herein, however, the scope of the disclose is not limited by the embodiments of the disclosure. In other embodiments, the number of conductive layers 112B and the dielectric layers 112A may be adjusted based on product requirement. In some embodiments, the conductive layers 112B are electrically connected to the conductive posts 106d of the semiconductor die 106. Furthermore, the conductive layers 112B are electrically connected to the through insulator vias 108. In some embodiments, the materials of the dielectric layer 112A and the conductive layer 112B of the redistribution layer 112 are similar to materials of the dielectric layer 104A and the conductive layer 104B mentioned for the redistribution layer 104. Therefore, the detailed description of the dielectric layer 112A and the conductive layer 112B will be omitted herein.

After forming the redistribution layer 112, a plurality of conductive pads 112C may be disposed on an exposed top surface of the topmost layer of the conductive layers 112B for electrically connecting with conductive balls. In certain embodiments, the conductive pads 112C are for example, under-ball metallurgy (UBM) patterns used for ball mount.

As shown in FIG. 1E, the conductive pads 112C are formed on and electrically connected to the redistribution layer 112. In some embodiments, the materials of the conductive pads 112C may include copper, nickel, titanium, tungsten, or alloys thereof or the like, and may be formed by an electroplating process, for example. The number of conductive pads 112C are not limited in this disclosure, and may be selected based on the design layout. In some alternative embodiments, the conductive pads 112C may be omitted. In other words, conductive balls 114 formed in subsequent steps may be directly disposed on the redistribution layer 112.

After forming the conductive pads 112C, a plurality of conductive balls 114 is disposed on the conductive pads 112C and over the redistribution layer 112. In some embodiments, the conductive balls 114 may be disposed on the conductive pads 112C by a ball placement process or reflow process. In some embodiments, the conductive balls 114 are, for example, solder balls or ball grid array (BGA) balls. In some embodiments, the conductive balls 114 are connected to the redistribution layer 112 through the conductive pads 112C. In certain embodiments, some of the conductive balls 114 may be electrically connected to the semiconductor die 106 through the redistribution layer 112. Furthermore, some of the conductive balls 114 may be electrically connected to the through insulator vias 108 through the redistribution layer 112. The number of the conductive balls 114 is not limited to the disclosure, and may be designated and selected based on the number of the conductive pads 112C. In some alternative embodiments, an integrated passive device (IPD) (not shown) may optionally be disposed on the redistribution layer 112 and be electrically connected to the redistribution layer 112.

Figure 1F:
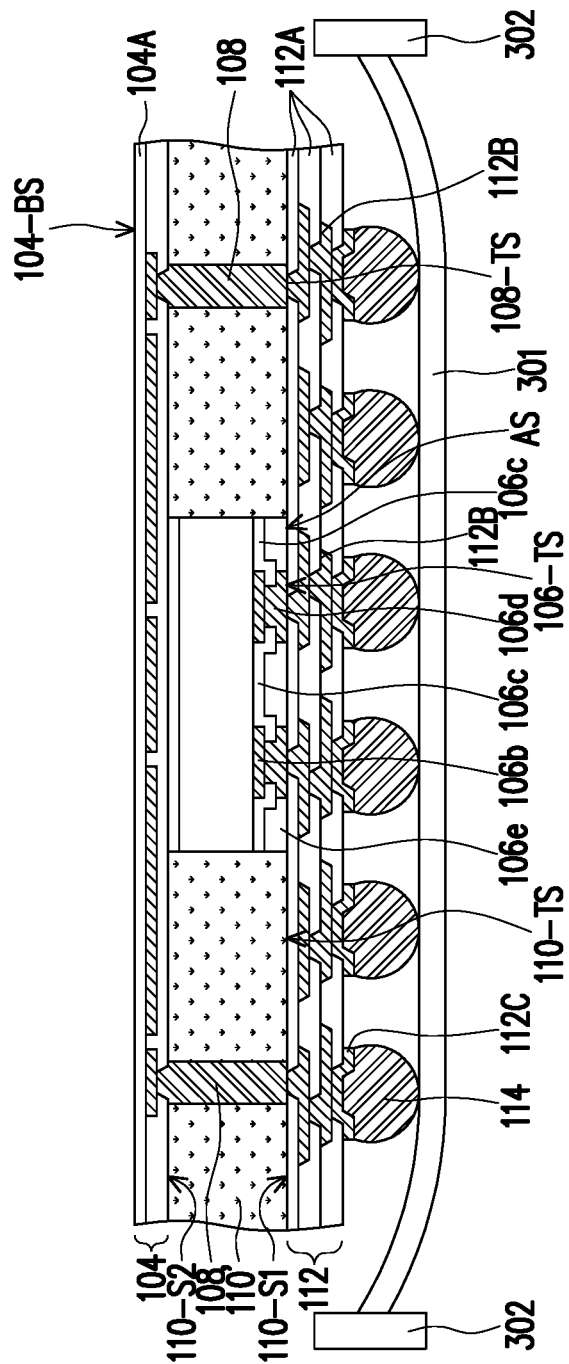

Referring to FIG. 1F, in some embodiments, after forming the redistribution layer 112 and placing the conductive balls 114 thereon, the structure shown in FIG. 1E may be turned upside down and attached to a tape 301 (e.g., a dicing tape) supported by a frame 302. As illustrated in FIG. 1F, the carrier 102 is debonded and is separated from the redistribution layer 104. In some embodiments, the de-bonding process includes projecting a light such as a laser light or an UV light on the debond layer (e.g., the LTHC release layer) so that the carrier 102 can be easily removed along with the debond layer. During the de-bonding step, the tape 301 is used to secure the package structure before de-bonding the carrier 102 and the debond layer. After the de-bonding process, a backside surface 104-BS of the redistribution layer 104 is revealed or exposed. In certain embodiments, a dielectric layer 104A of the redistribution layer 104 is revealed or exposed.

Figure 1G:
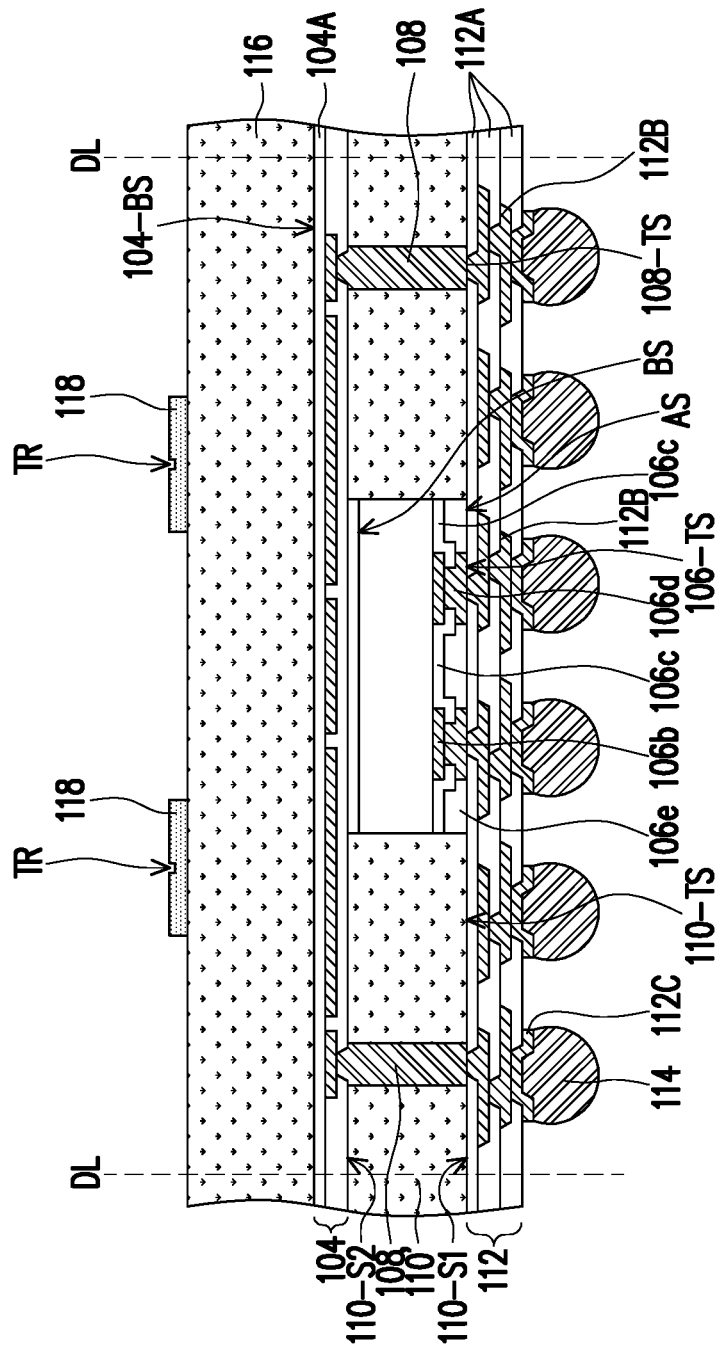

Referring to FIG. 1G, in some embodiments, after de-bonding the carrier 102, a second insulating encapsulant 116 is formed on the redistribution layer 104 and over the semiconductor die 106. In some embodiments, the redistribution layer 104 is sandwiched between the second insulating encapsulant 116 and the insulating encapsulant 110'. In some embodiments, the second insulating encapsulant 116 includes, for example, epoxy resins or any other suitable type of molding materials. In some embodiments, the material of the second insulating encapsulant 116 has low permittivity (Dk) and low loss tangent (DO properties. Depending on the frequency range of the high-speed applications, suitable materials of the encapsulant may be selected based on the required electrical properties of the package. In some embodiments, the material of the second insulating encapsulant 116 can be the same as the material of the insulating encapsulant 110'. In an alternative embodiment, the material of the second insulating encapsulant 116 can be different from the material of the insulating encapsulant 110', but the disclosure is not limited thereto.

As illustrated in FIG. 1G, in some embodiments, a plurality of antenna patterns 118 are formed on the second insulating encapsulant 116. In certain embodiments, the plurality of antenna patterns 118 are located over the backside surface BS of the semiconductor die 106. Furthermore, in some embodiments, the antenna patterns 118 includes trenches TR located on a surface of the antenna patterns 118. The details of forming the antenna patterns 118 having trenches TR will be described in a later section. As shown in FIG. 1G, in some embodiments, the antenna patterns 118 may be electrically coupled with the conductive layer 104B, wherein the conductive layer 104B may serve as ground plates. In certain embodiments, the antenna patterns 118 may include patch antennas, which are arranged in form of a matrix to surround the semiconductor die 106.

Figure 1H:
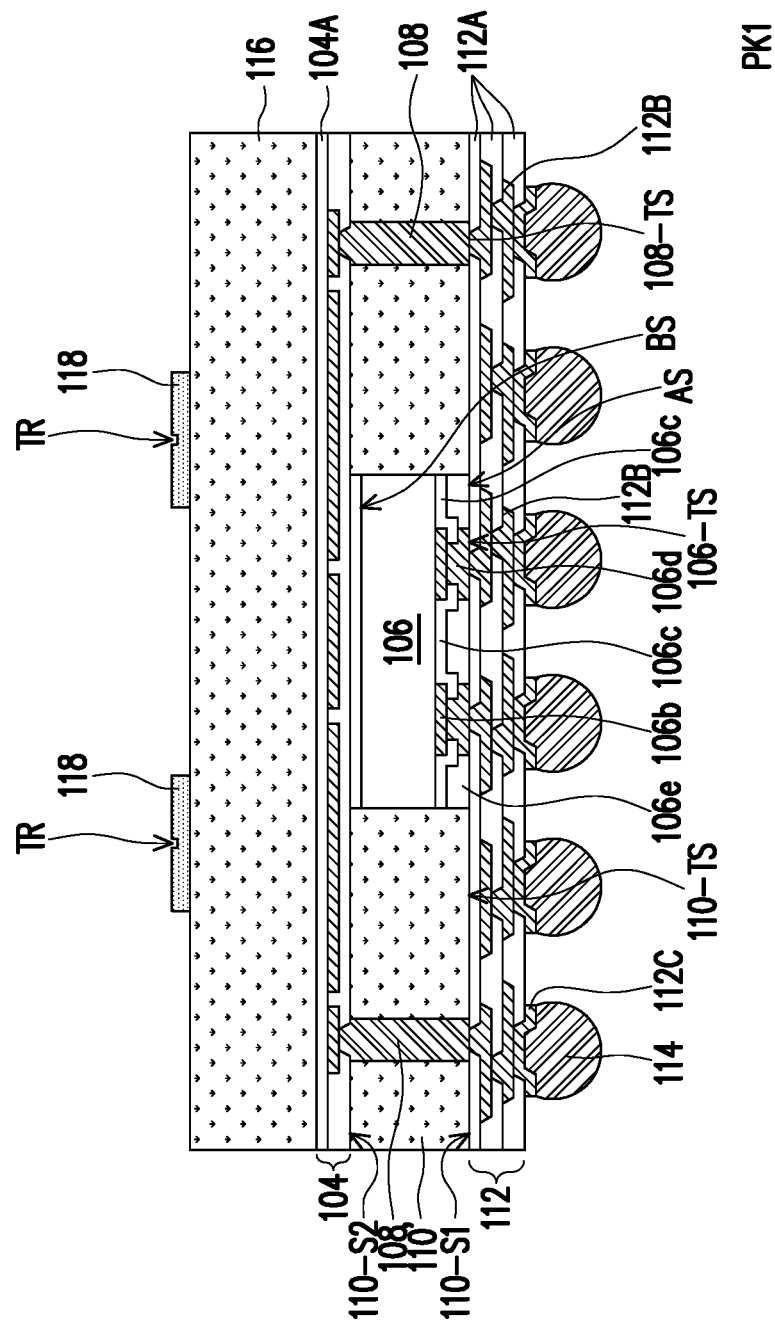

Referring to FIG. 1H, after forming the antenna patterns 118, a dicing process is performed along the dicing lines DL (shown in FIG. 1G) to cut the whole wafer structure (cutting through the insulating encapsulant 110', the second insulating encapsulant 116, the redistribution layer 104 and the redistribution layer 112) into a plurality of packages PK1. In the exemplary embodiment, the dicing process is a wafer dicing process including mechanical blade sawing or laser cutting. In a subsequent process, the separated packages PK1 may for example, be disposed onto a circuit substrate or onto other components based on requirements.

Figure 2A:
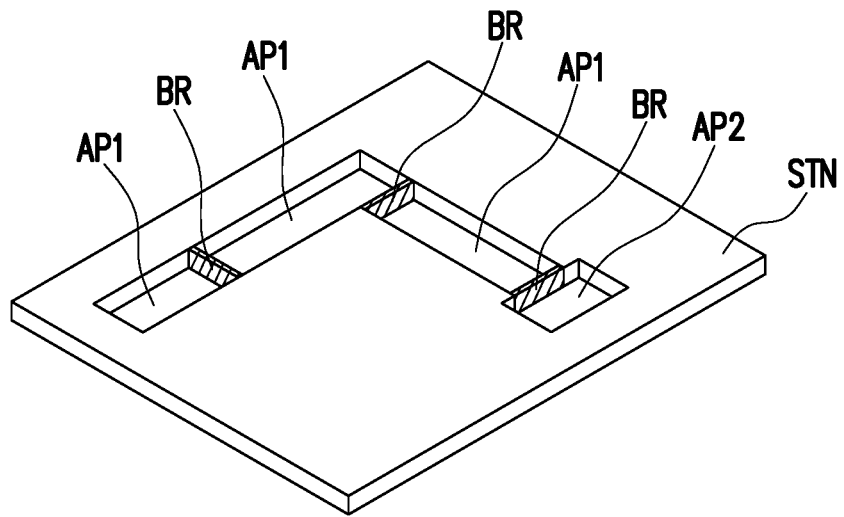
FIG. 2A to FIG. 2D are schematic views of various stages in a method of fabricating an antenna pattern according to some exemplary embodiments of the present disclosure.

FIG. 2A to FIG. 2D are schematic views of various stages in a method of fabricating an antenna pattern according to some exemplary embodiments of the present disclosure. In some embodiments, the antenna patterns 118 shown in the package PK1 of FIG. 1H may be formed by the process shown in FIG. 2A to FIG. 2D. As illustrated in FIG. 2A, a stencil STN may be provided over the backside surface 104-BS of the redistribution layer 104 and on the second insulating encapsulant 116. For example, the stencil STN may include a plurality of aperture patterns (AP1/AP2) and a plurality of bridge structures BR separating the aperture patterns (AP1/AP2). In some embodiments, the aperture patterns may include stripe aperture patterns AP1 for forming antenna stripes, and block aperture pattern AP2 for forming antenna blocks in subsequent steps. The strip aperture patterns AP1 and block aperture pattern AP2 may be separated from one another by the bridge structure BR.

Figure 2B:
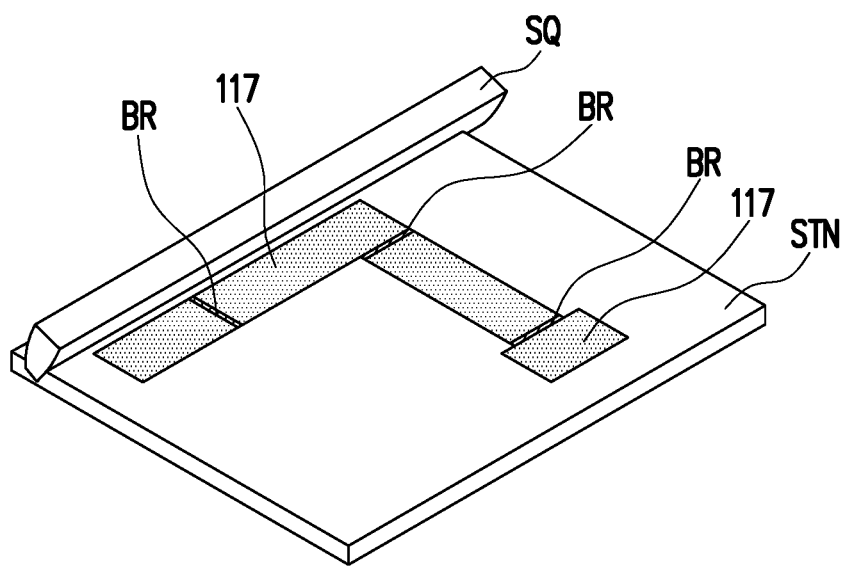
Figure 2C:
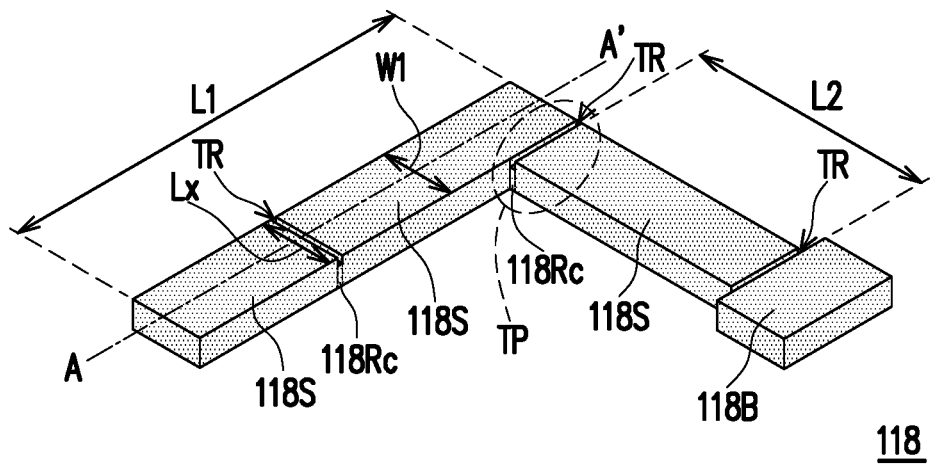

Referring to FIG. 2B, in a next step, conductive materials 117 are pasted into the plurality of aperture patterns (AP1/AP2). The conductive materials 117 may include copper, silver, or any other types of conductive materials suitable for antenna applications. After pasting or printing the conductive materials 117 in the aperture patterns (AP1/AP2), excess conductive materials 117 are removed by a squeegee SQ, so that the conductive materials 117 can have a substantially planar top surface. Referring to FIG. 2C, after pasting the conductive materials 117, the stencil STN is lifted and removed, and the conductive materials 117 is cured to form the antenna patterns 118. In the exemplary embodiment, during the removal of the stencil STN, adjacent conductive materials 117 separated by the bridge structures BR will merge towards one another. As such, after curing the conductive materials 117, the merged conductive materials 117 will form recessed antenna portions 118Rc. In certain embodiments, a position of the recessed antenna portions 118Rc corresponds to a position where the trenches TR are located on the antenna patterns 118.

Figure 2D:
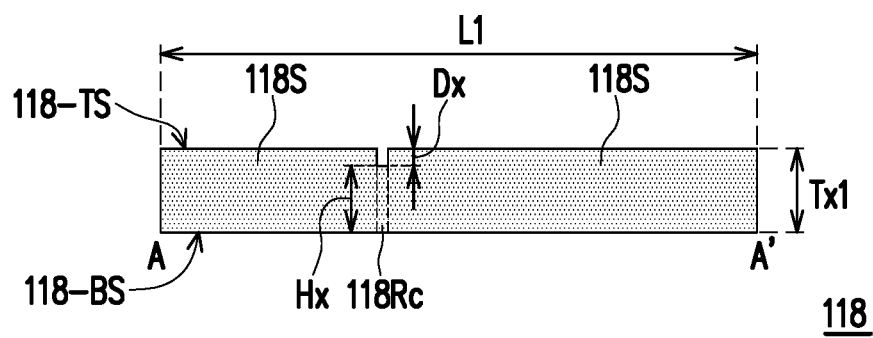

FIG. 2D is a sectional view taken along the lines A-A' of the antenna patterns 118 shown in FIG. 2C. As illustrated in FIGS. 2C and 2D, in some embodiments, the antenna patterns 118 has a top surface 118-TS and a bottom surface 118-BS opposite to the top surface 118-TS. In certain embodiments, the bottom surface 118-BS is attached to the second insulating encapsulant 116, whereas the top surface 118-TS is facing away from the second insulating encapsulant 116. In some embodiments, the antenna patterns 118 includes a plurality of antenna stripes 118S and an antenna block 118B. The antenna stripes 118S are connected to one another through the recessed antenna portions 118Rc. In other words, the recessed antenna portions 118Rc joins the antenna stripes 118S together. In certain embodiments, one of the antenna stripe 118S is connected to the antenna block 118B through the recessed antenna portion 118Rc. In other words, the recessed antenna portions 118Rc join the antenna stripe 118S to the antenna block 118B. In general, the size of the antenna patterns 118 is constrained by the stencil stuffiness, and antenna patterns will deform under large openings in the stencil STN. By using the method described above, large antenna patterns 118 may be fabricated without deformation.

In order to avoid the deformation of the antenna patterns 118, the following design rules may be applied. For example, in some embodiments, the bridge structures BR are positioned in the stencil STN at certain positions for preventing the formation of antenna patterns 118 that are excessively long/large, or have sharp turns or changes in shapes of the antenna patterns 118. In other words, the position of the bridge structures BR may correspond to the position of the formed recessed antenna portion 118Rc for joining the antenna stripes 118S/antenna blocks 118B, and correspond to the position of the trenches TR on the antenna patterns 118. As illustrated in FIG. 2C and FIG. 2D, in some embodiments, the plurality of trenches TR is located on the surface of the antenna patterns 118 at turning points TP of the antenna patterns 118. For example, the turning point TP may be viewed as the point where the antenna stripes 118S changes its extension direction. In some embodiments, the plurality of trenches TR is located on a surface of the plurality of antenna stripes 118 having a length of greater than 0.5 cm. For example, a length L1 of the antenna stripes 118S is greater than 0.5 cm, therefore, a trench TR (or recessed antenna portion 118Rc) is formed to prevent the antenna patterns 118 from being excessively long. In some embodiments, the plurality of trenches TR is located on a surface of the antenna patterns 118 at positions where the plurality of antenna stripes 118S is joining the plurality of antenna blocks 118B. In some embodiments, a length L2 of the antenna stripe 118S is smaller than 0.5 cm, hence a bridge structure BR is not designed in the stencil STN, and a trench TR is not formed at the corresponding position.

Furthermore, referring to FIG. 2D, in some embodiments, a ratio of a depth Dx of the plurality of trenches TR to a thickness Tx1 of the antenna pattern 118 is in a range of 1:5 to 1:20. In certain embodiments, the antenna stripes 118S and the antenna blocks 118B of the antenna pattern 118 have the same thickness Tx1. In some embodiments, a height Hx of the plurality of recessed antenna portions 118Rc is smaller than the thickness Tx1 of the plurality of antenna stripes 118S. In certain embodiments, a length Lx of the plurality of recessed antenna portions 118Rc is equal to a width W1 of the plurality of antenna stripes 118S. In some exemplary embodiments, a height variation (Tx1 vs. Hx) between the plurality of antenna stripes 118S and the plurality of recessed antenna portions 118Rc is less than 5 μm.

Figure 3A:
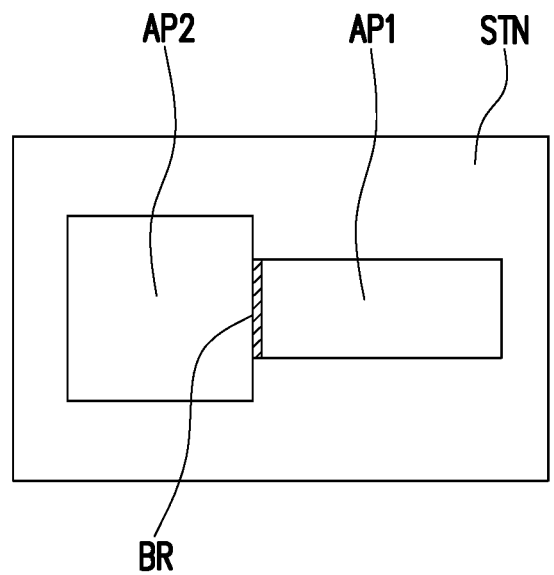
FIG. 3A and FIG. 3B are schematic top views of a stencil and an antenna pattern formed by using the stencil according to some exemplary embodiments of the present disclosure.
Figure 3B:
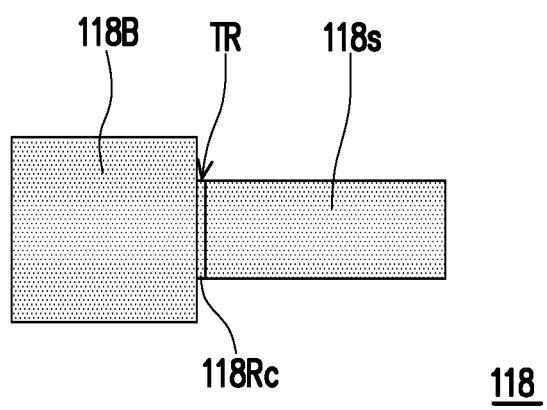

FIG. 3A and FIG. 3B are schematic top views of a stencil and an antenna pattern formed by using the stencil according to some exemplary embodiments of the present disclosure. In order to form the desired antenna pattern 118 shown in FIG. 3B, the stencil STN shown in FIG. 3A is provided. As illustrated in FIG. 3A, the stencil STN has a stripe aperture pattern AP1 and a block aperture pattern AP2. Furthermore, in some embodiments, a bridge structure BR is provided to separate the stripe aperture pattern AP1 from the block aperture pattern AP2. As such, when forming the antenna patterns 118 shown in FIG. 3B, deformation of the antenna patterns can be prevented. As illustrated in FIG. 3B, the formed antenna pattern 118 includes an antenna stripe 118S and an antenna block 118B, wherein the antenna stripe 118S is joined with the antenna block 118B via the recessed antenna portion 118Rc. Furthermore, due to the formation of the recessed antenna portion 118Rc, a trench TR is located in between the antenna stripe 118S and the antenna block 118B.

Figure 4A:
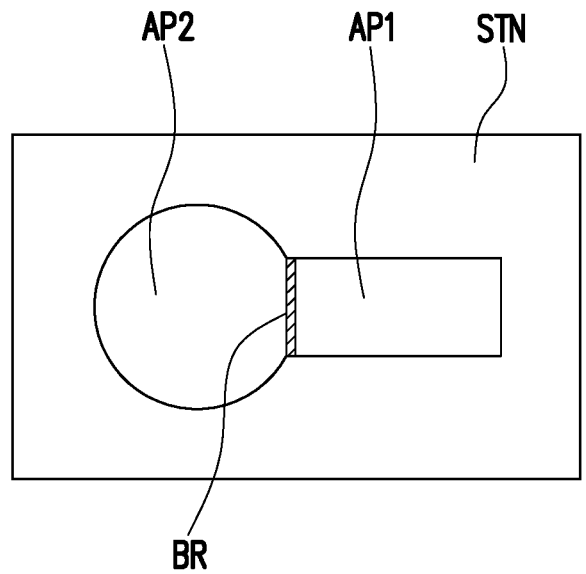
FIG. 4A and FIG. 4B are schematic top views of a stencil and an antenna pattern formed by using the stencil according to some exemplary embodiments of the present disclosure.
Figure 4B:
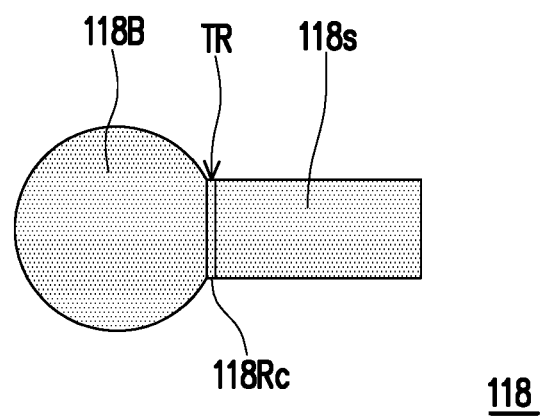

FIG. 4A and FIG. 4B are schematic top views of a stencil and an antenna pattern formed by using the stencil according to some exemplary embodiments of the present disclosure. In order to form the desired antenna pattern 118 shown in FIG. 4B, the stencil STN shown in FIG. 4A is provided. The stencil STN and antenna pattern 118 illustrated in FIG. 4A and FIG. 4B are similar to the stencil STN and antenna pattern 118 illustrated in FIG. 3A and FIG. 3B, hence the same reference numerals are used to refer to the same or liked parts, and its detailed description will be omitted herein. The difference between the embodiments is that the block aperture pattern AP2 and the formed antenna block 118B illustrated in FIGS. 3A-3B is square-shaped, whereas the block aperture pattern AP2 and the formed antenna block 118B illustrated in FIGS. 4A-4B is circular-shaped. From the above embodiments, it should be noted that the shape of the block aperture pattern AP2 is not limited thereto, and can be square-shaped, circular-shaped or any other polygonal shapes based on design requirement. Thereafter, the desired shape of antenna block 118B may be formed using the stencil STN with such block aperture pattern AP2.

Figure 5A:
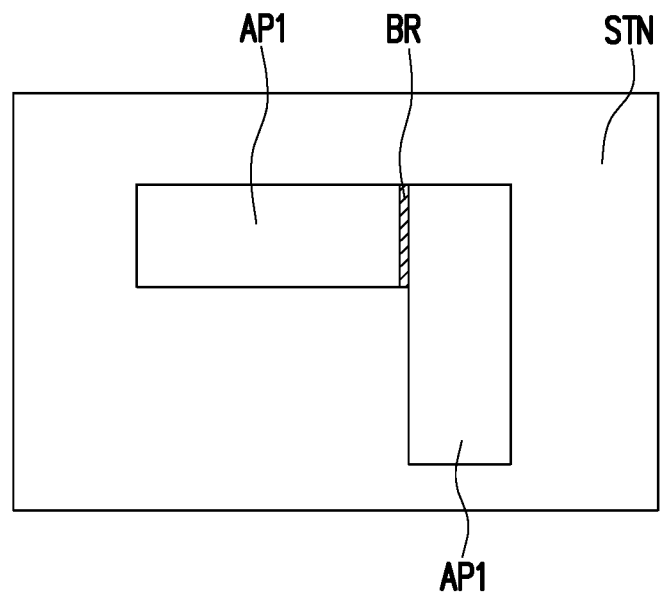
FIG. 5A and FIG. 5B are schematic top views of a stencil and an antenna pattern formed by using the stencil according to some exemplary embodiments of the present disclosure.
Figure 5B:
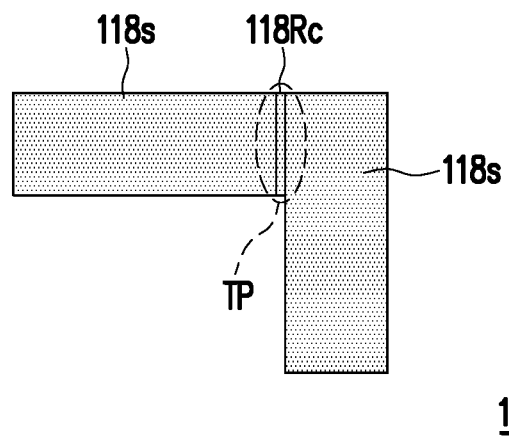

FIG. 5A and FIG. 5B are schematic top views of a stencil and an antenna pattern formed by using the stencil according to some exemplary embodiments of the present disclosure. In order to form the desired antenna pattern 118 shown in FIG. 5B, the stencil STN shown in FIG. 5A is provided. As illustrated in FIG. 5A, the stencil STN has two stripe aperture patterns AP1. Since one stripe aperture pattern AP1 is orthogonal to the other stripe aperture pattern AP1, a bridge structure BR is provided to separate the stripe aperture patterns AP1 from one another. As such, when forming the antenna pattern 118 shown in FIG. 5B, the deformation of the antenna pattern due to the presence of a turning point TP in the antenna design may be prevented. As illustrated in FIG. 5B, the formed antenna pattern 118 includes two antenna stripes 118S, wherein the two antenna stripes 118S are joined with one another via the recessed antenna portion 118Rc. Furthermore, due to the formation of the recessed antenna portion 118Rc, a trench TR is located in between the two antenna stripes 118S at the turning point TP.

Figure 6A:
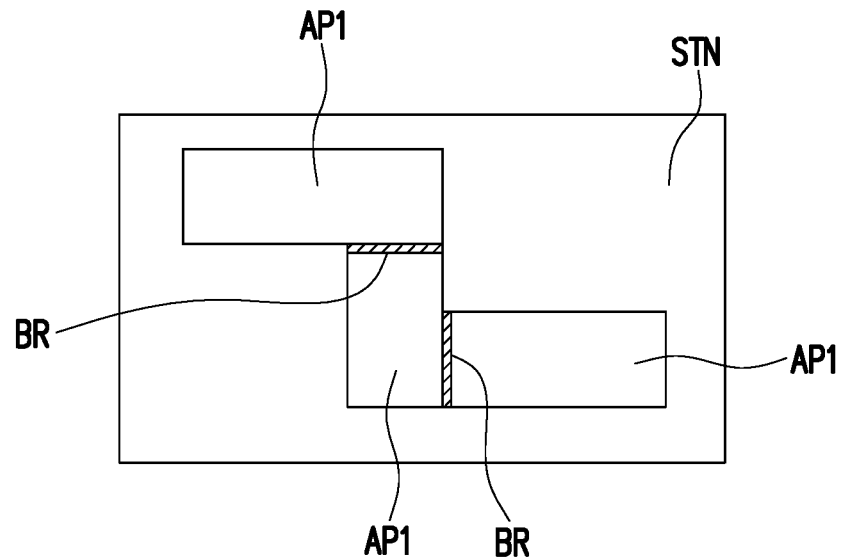
FIG. 6A and FIG. 6B are schematic top views of a stencil and an antenna pattern formed by using the stencil according to some exemplary embodiments of the present disclosure.
Figure 6B:
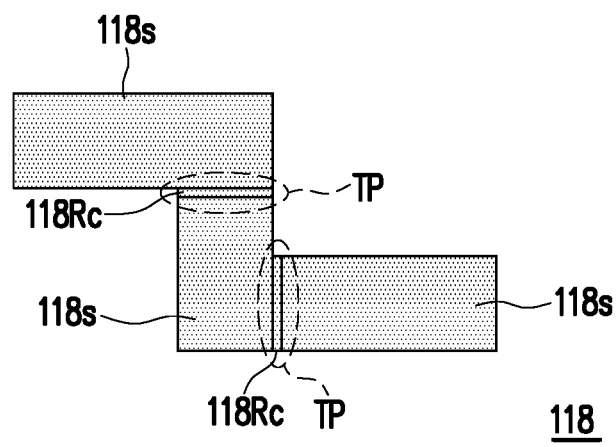

FIG. 6A and FIG. 6B are schematic top views of a stencil and an antenna pattern formed by using the stencil according to some exemplary embodiments of the present disclosure. In order to form the desired antenna pattern 118 shown in FIG. 6B, the stencil STN shown in FIG. 6A is provided. The stencil STN and antenna pattern 118 illustrated in FIG. 6A and FIG. 6B are similar to the stencil STN and antenna pattern 118 illustrated in FIG. 5A and FIG. 5B, hence the same reference numerals are used to refer to the same or liked parts, and its detailed description will be omitted herein. The difference between the embodiments is that two stripe aperture patterns AP1 and two antenna stripes 118S are illustrated in FIGS. 5A and 5B, whereas three stripe aperture patterns AP1 and three antenna stripes 118S are illustrated in FIGS. 6A and 6B. As shown in FIG. 6A, since three stripe aperture patterns AP1 are formed with two turning points, two bridge structures BR are provided to separate the stripe aperture patterns AP1 from one another. As such, when forming the antenna patterns 118, two recessed antenna portions 118Rc are formed at the turning point TP for joining the antenna stripes 118S. Similarly, trenches TR are located in between neighboring antenna stripes 118S at the turning point TP. According to the above embodiments, it should be noted that bridge structures BR are designed in the stencil STN at positions corresponding to each of the turning points TP in the antenna pattern 118. Therefore, the antenna pattern 118 may be formed without deformation.

Figure 7A:
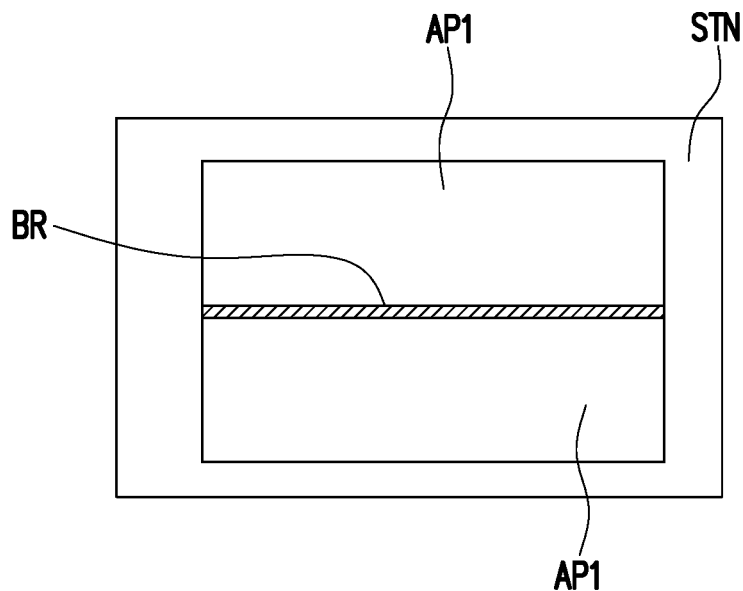
FIG. 7A and FIG. 7B are schematic top views of a stencil and an antenna pattern formed by using the stencil according to some exemplary embodiments of the present disclosure.
Figure 7B:
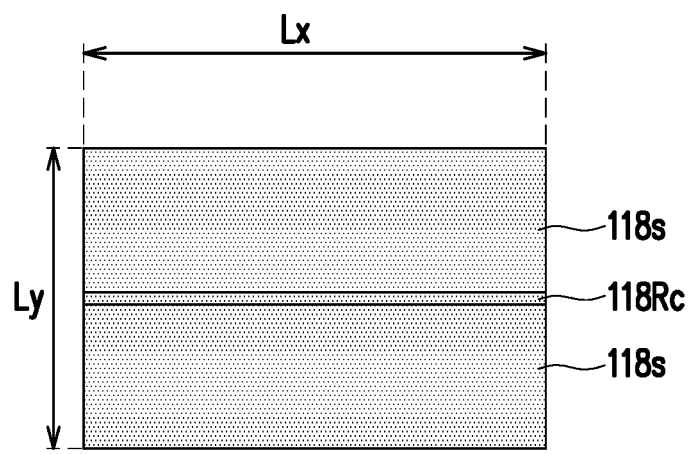

FIG. 7A and FIG. 7B are schematic top views of a stencil and an antenna pattern formed by using the stencil according to some exemplary embodiments of the present disclosure. In order to form the desired antenna pattern 118 shown in FIG. 7B, the stencil STN shown in FIG. 7A is provided. As illustrated in FIG. 7B the desired antenna pattern 118 has lengths Lx and Ly that are greater than 0.5 cm. Therefore, in order to prevent antenna deformation, the stencil STN shown in FIG. 7A is designed to include a bridge structure BR that separates the two stripe aperture patterns AP1 from one another. As illustrated in FIG. 7B, the formed antenna pattern 118 includes two antenna stripes 118S located side by side, wherein the two antenna stripes 118S are joined with one another via the recessed antenna portion 118Rc. Furthermore, due to the formation of the recessed antenna portion 118Rc, a trench TR is located in between the two antenna stripes 118S.

Figure 8A:
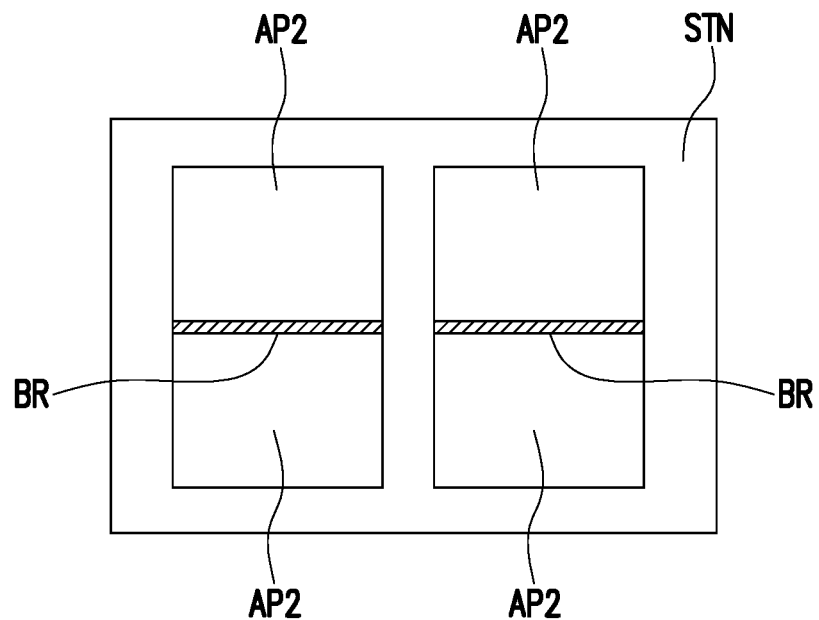
FIG. 8A and FIG. 8B are schematic top views of a stencil and an antenna pattern formed by using the stencil according to some exemplary embodiments of the present disclosure.
Figure 8B:
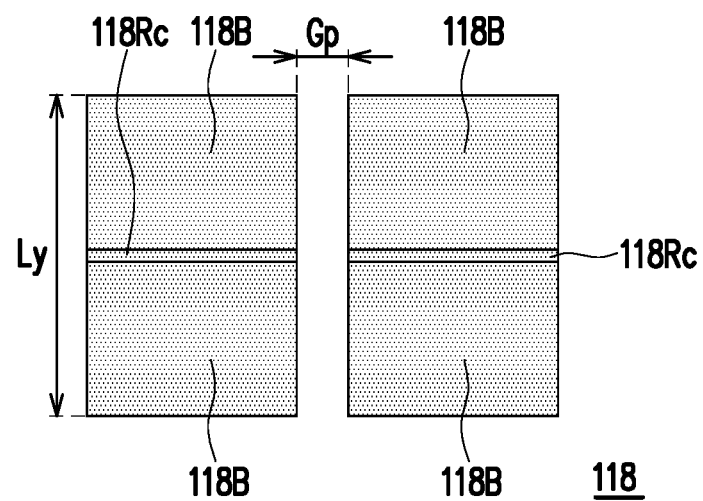

FIG. 8A and FIG. 8B are schematic top views of a stencil and an antenna pattern formed by using the stencil according to some exemplary embodiments of the present disclosure. In order to form the desired antenna pattern 118 shown in FIG. 8B, the stencil STN shown in FIG. 8A is provided. As illustrated in FIG. 8B the desired antenna pattern 118 has a length Ly that is greater than 0.5 cm. Therefore, in order to prevent antenna deformation, the stencil STN shown in FIG. 7A is designed to include a bridge structure BR that separates the two block aperture patterns AP2 from one another. As illustrated in FIG. 7B, the formed antenna pattern 118 includes four antenna blocks 118B, wherein two antenna blocks 118B are separated from the other two antenna blocks 118B by a gap GP. In some embodiments, the gap GP is at least larger than 100 μm, to prevent adjacent conductive materials from merging towards one another.

Figure 9A:
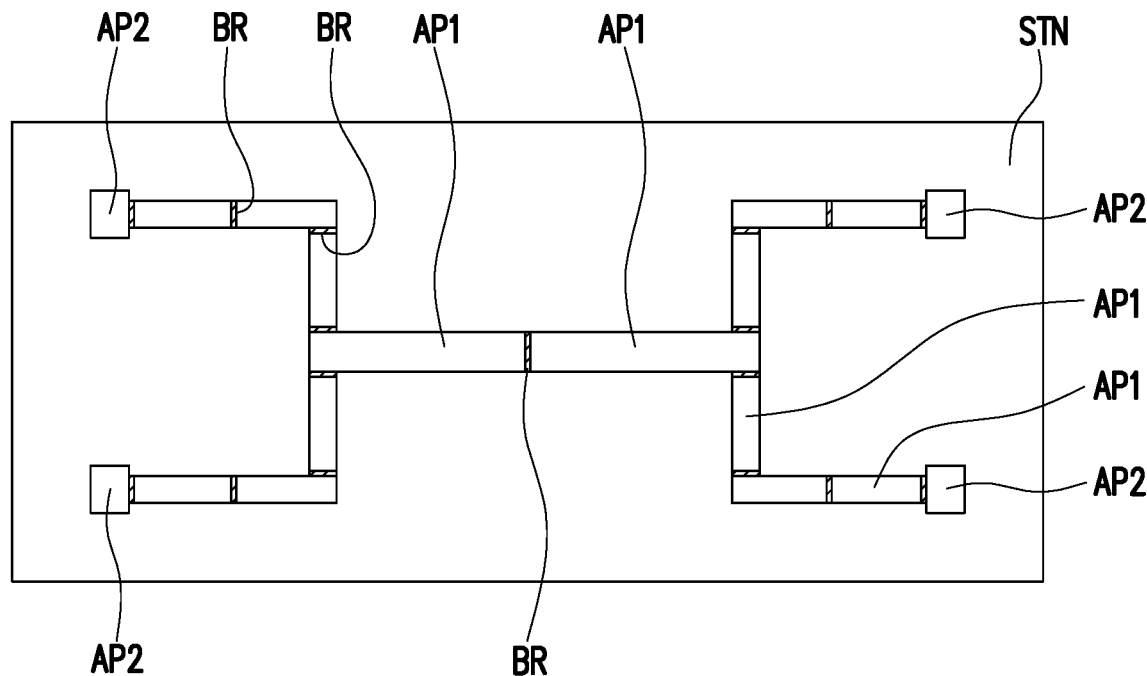
FIG. 9A and FIG. 9B are schematic top views of a stencil and an antenna pattern formed by using the stencil according to some exemplary embodiments of the present disclosure.
Figure 9B:
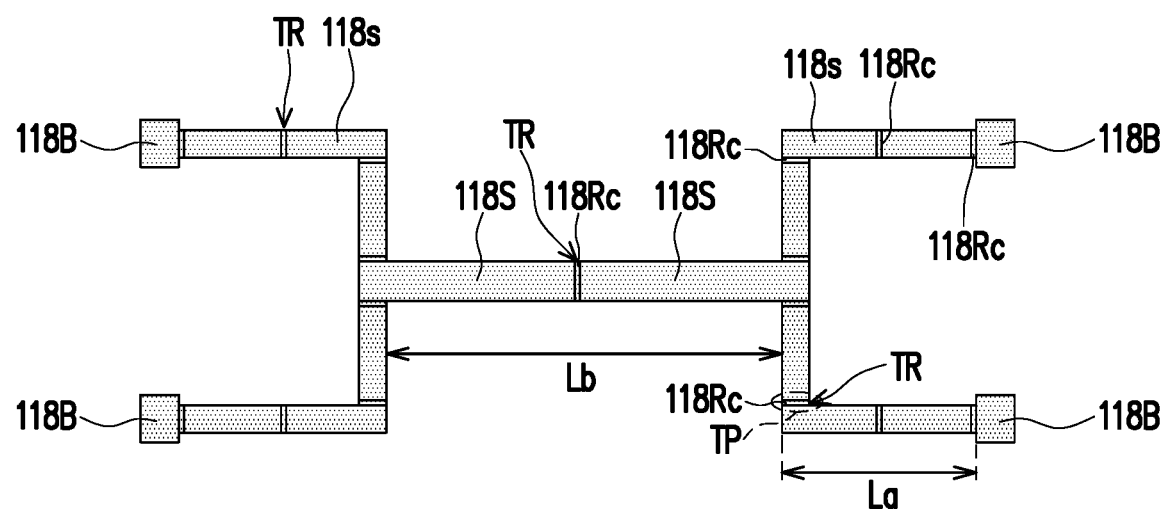

FIG. 9A and FIG. 9B are schematic top views of a stencil and an antenna pattern formed by using the stencil according to some exemplary embodiments of the present disclosure. In order to form the desired antenna pattern 118 shown in FIG. 9B, the stencil STN shown in FIG. 9A is provided. The stencil STN and antenna pattern 118 shown in FIGS. 9A and 9B are formed based on the design rule shown in the embodiments above. For example, referring to FIGS. 9A and 9B, trenches TR (corresponding to positions of the recessed antenna portions Rc) are located on a surface of the antenna stripes 118S having lengths (La and Lb) of greater than 0.5 cm. In some embodiments, the trenches TR (or recessed antenna portions Rc) are located at positions where the antenna stripes 118S are joining the antenna blocks 118B.

Furthermore, in certain embodiments, the trenches TR (or recessed antenna portions Rc) are located on the surface of the plurality of antenna patterns 118 at turning points TP of the plurality of antenna patterns 118. These trenches TR (or recessed antenna portions Rc) are formed by designing bridge structures BR in the stencil STN at the corresponding position, so that the deformation of the antenna patterns 118 can be prevented.

Figure 10:
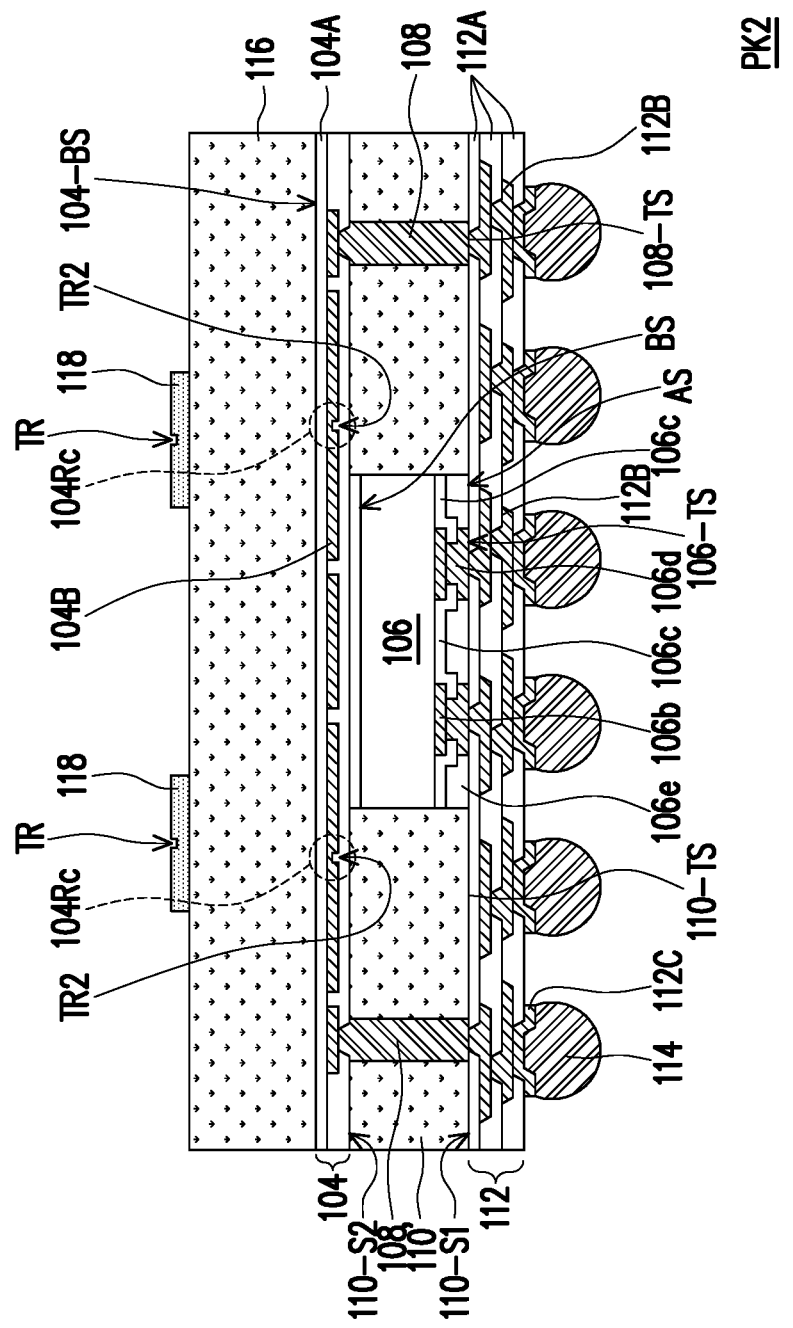
FIG. 10 is a sectional view of a package structure according to some other embodiments of the present disclosure.

FIG. 10 is a sectional view of a package structure according to some other embodiments of the present disclosure. The package structure PK2 illustrated in FIG. 10 is similar to the package structure PK1 illustrated in FIG. 1H, hence the same reference numerals are used to refer to the same or liked parts, and its detailed description will be omitted herein. The difference between the embodiments is that in the package structure PK2 of FIG. 10, the redistribution layer 104 further includes a plurality of trenches TR2 located on the surface of the redistribution layer 104, or on the surface of the conductive layers 104B. In some embodiments, a width of the conductive layers 104B is substantially equal to a length of the trenches TR2. In some embodiments, the trenches TR2 are formed according to the same method described in FIG. 2A to FIG. 2D, whereby bridge structures are designed in the stencil to avoid the pattern deformation in the conductive layers 104B of redistribution layer 104. By using the same method of forming the antenna patterns 118 described above, the redistribution layer 104 may be designed with recessed portions 104Rc, stripe patterns or block patterns (not shown) based on actual design requirement.

Figure 11:
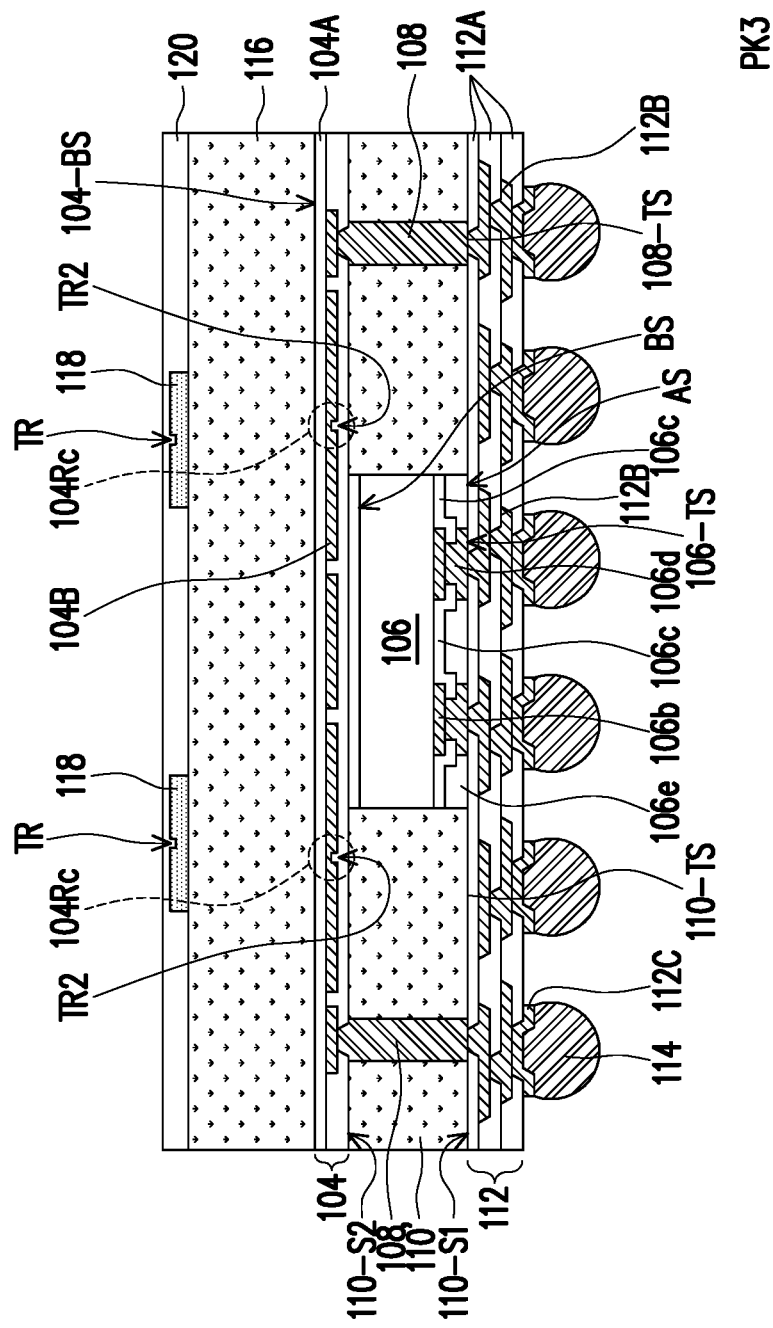
FIG. 11 is a sectional view of a package structure according to some other embodiments of the present disclosure.

FIG. 11 is a sectional view of a package structure according to some other embodiments of the present disclosure. The package structure PK3 illustrated in FIG. 11 is similar to the package structure PK2 illustrated in FIG. 10, hence the same reference numerals are used to refer to the same or liked parts, and its detailed description will be omitted herein. The difference between the embodiments is that in the package structure PK3 of FIG. 11, a protection layer 120 is further formed over the antenna patterns 118 to protect the antenna patterns 118. The protection layer 120 may be any type of materials suitable for protecting the antenna patterns 118, and the disclosure is not limited thereto.

Figure 12:
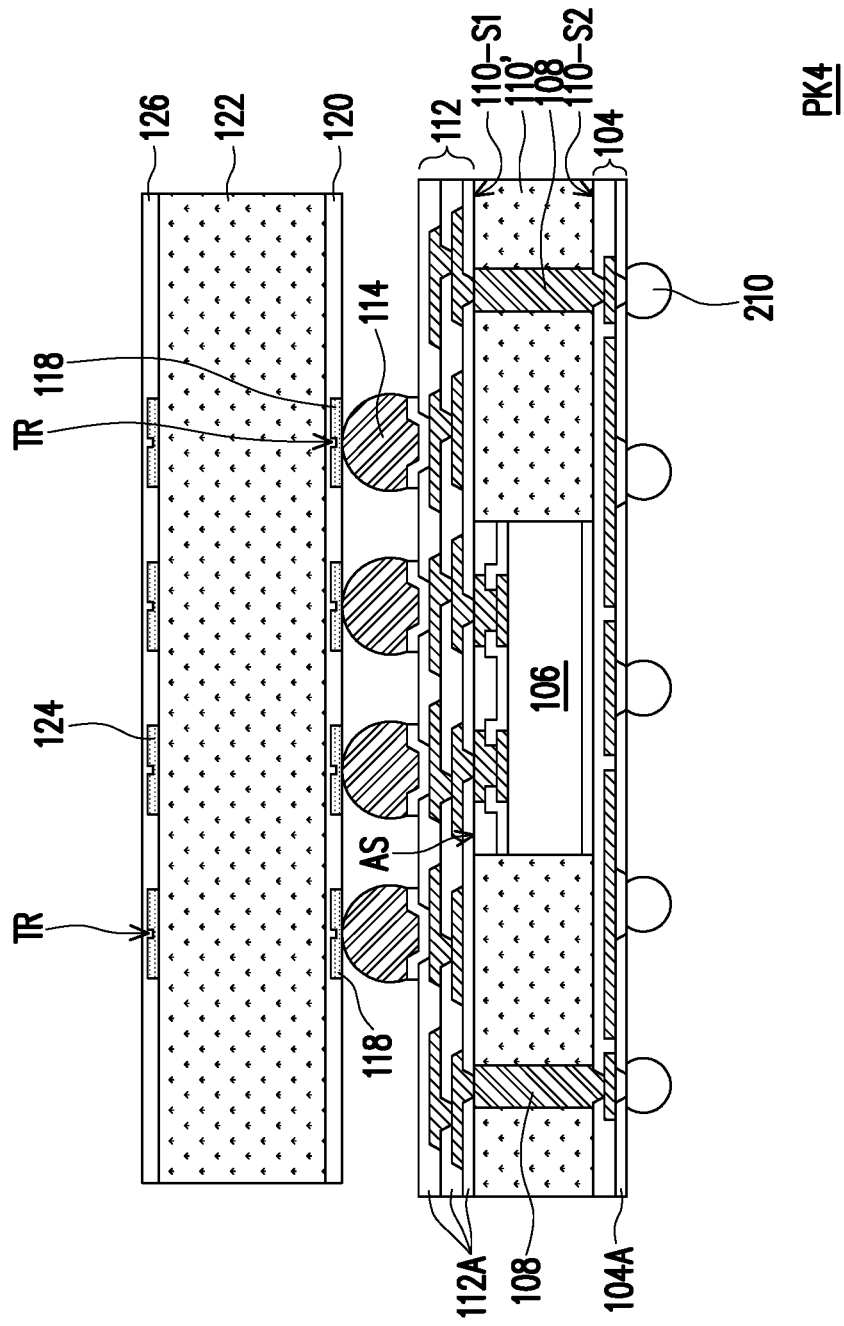
FIG. 12 is a sectional view of a package structure according to some other embodiments of the present disclosure.

FIG. 12 is a sectional view of a package structure according to some other embodiments of the present disclosure. The package structure PK4 illustrated in FIG. 12 is similar to the package structure PK1 illustrated in FIG. 1H, hence the same reference numerals are used to refer to the same or liked parts, and its detailed description will be omitted herein. The difference between the embodiments is in the arrangement of the antenna patterns 118. Referring to FIG. 12, the antenna patterns 118 are located over the active surface AS of the semiconductor die 106 and electrically connected to the redistribution layer 112 through the conductive balls 114. Furthermore, conductive balls 210 are located on the redistribution layer 104 and electrically connected to the redistribution layer 104.

As illustrated in FIG. 12, in some embodiments, the antenna patterns 118 are covered by a protection layer 120, and a second insulating encapsulant 122 is formed over the antenna patterns 118 and on the protection layer 120. Additionally, in certain embodiments, a plurality of second antenna patterns 124 are located over the antenna patterns 118, wherein the second insulating encapsulant 122 is sandwiched in between the second antenna patterns 124 and the antenna patterns 118. Furthermore, a second protection layer 126 is formed on the second antenna patterns 124 to cover and protect the second antenna patterns 124. In some embodiments, the position of the second antenna patterns 124 overlaps with the position of the antenna patterns 118. In some embodiments, the second antenna patterns 124 may serve as directors for the antenna patterns 118, to enhance the performance of the antenna. The design of the second antenna patterns 124 may be similar to the design of the antenna patterns 118. In other words, the antenna patterns 118 and the second antenna patterns 124 include trenches TR located on their surface.

In the exemplary embodiment, similar to the antenna patterns 118, the second antenna patterns 124 may include any of the designs shown in FIGS. 3A and 3B to FIGS. 9A and 9B. For example, in some embodiments, the second antenna patterns 124 may include a plurality of antenna stripes located over the second insulating encapsulant 122. Furthermore, a plurality of second recessed antenna portions may be located over the second insulating encapsulant 122 and joining the plurality of second antenna stripes together. In some embodiments, a height of the plurality of second recessed antenna portions is smaller than a thickness of the plurality of second antenna stripes, and a length of the plurality of second recessed antenna portions is equal to a width of the plurality of second antenna stripes. By forming the antenna patterns 118 and the second antenna patterns 124 according to the above embodiments, a deformation issue can be resolved.

Figure 13:
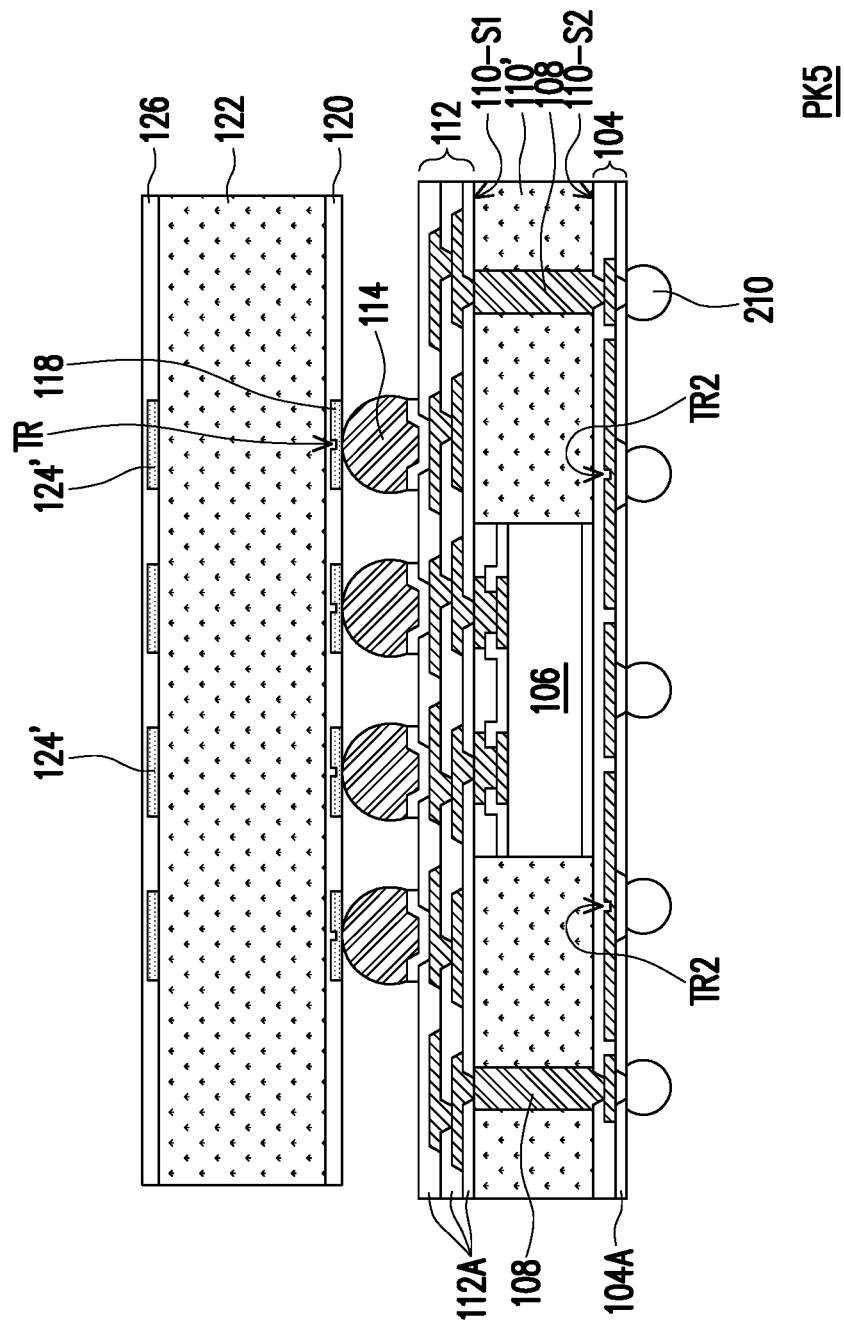
FIG. 13 is a sectional view of a package structure according to some other embodiments of the present disclosure.

FIG. 13 is a sectional view of a package structure according to some other embodiments of the present disclosure. The package structure PK5 illustrated in FIG. 13 is similar to the package structure PK4 illustrated in FIG. 13, hence the same reference numerals are used to refer to the same or liked parts, and its detailed description will be omitted herein. The difference between the embodiments is that trenches TR are omitted from the second antenna patterns 124' of the package structure PK5. Alternatively, the redistribution layer 104 may be formed to include trenches TR2. By forming the antenna patterns 118 and the redistribution layer 104 according to the above embodiments, a deformation issue can be resolved.

According to the above embodiments, the antenna patterns are formed to include a plurality of trenches located on its surface. These trenches are formed by positioning bridge structures in corresponding positions in the stencil, so as to prevent the formation of antenna patterns that are excessively long/large, or have sharp turns or changes in shapes of the antenna patterns. As such, a deformation issue of the antenna patterns can be resolved. Furthermore, the same method may be applied to other patterns (e.g. RDL patterns) for large and complex paste designs.

In some embodiments of the present disclosure, a package structure including a semiconductor die, an insulating encapsulant, a redistribution layer and a plurality of antenna patterns is provided. The semiconductor die has an active surface and a backside surface opposite to the active surface. The insulating encapsulant is encapsulating the semiconductor die. The redistribution layer is located on the active surface of the semiconductor die and over the insulating encapsulant. The plurality of antenna patterns is located over the semiconductor die, wherein the plurality of antenna patterns comprises a plurality of trenches located on a surface of the plurality of antenna patterns.

In some other embodiments of the present disclosure, a package structure including at least one semiconductor die, an insulating encapsulant, a redistribution layer, a backside redistribution layer and antenna patterns is provided. The insulating encapsulant is encapsulating the at least one semiconductor die, wherein the insulating encapsulant has a first surface and a second surface opposite to the first surface. The redistribution layer is located on the first surface of the insulating encapsulant. The backside redistribution layer is located on the second surface of the insulating encapsulant. The antenna patterns include a plurality of antenna stripes and a plurality of recessed antenna portions. The plurality of antenna stripes is located over the redistribution layer or over the backside redistribution layer. The plurality of recessed antenna portions is located over the redistribution layer or over the backside redistribution layer and joining the plurality of antenna stripes together, wherein a height of the plurality of recessed antenna portions is smaller than a thickness of the plurality of antenna stripes, and a length of the plurality of recessed antenna portions is equal to a width of the plurality of antenna stripes.

In yet another embodiment of the present disclosure, a method of fabricating a package structure is described. The method includes the following steps. A backside redistribution layer is formed on a carrier. At least one semiconductor die is bonded on the backside redistribution layer. An insulating encapsulant is formed to encapsulate the at least one semiconductor die. A top redistribution layer is formed over the insulating encapsulant. The carrier is de-bonded to reveal a backside surface of the backside redistribution layer. A plurality of antenna patterns is formed over the top redistribution layer or over the backside redistribution layer, wherein the plurality of antenna patterns is formed with a plurality of trenches located on a surface of the plurality of antenna patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die having an active surface and a backside surface opposite to the active surface;
   an insulating encapsulant encapsulating the semiconductor die;
   a redistribution layer located on the active surface of the semiconductor die and over the insulating encapsulant; and
   a plurality of antenna patterns located over the semiconductor die, wherein the plurality of antenna patterns comprises a plurality of trenches located on a surface of the plurality of antenna patterns.

2. The package structure according to claim 1, wherein the plurality of trenches is located on the surface of the plurality of antenna patterns at turning points of the plurality of antenna patterns.

3. The package structure according to claim 1, wherein the plurality of antenna patterns comprises a plurality of antenna stripes, and the plurality of trenches is located on a surface of the plurality of antenna stripes having a length of greater than 0.5 cm.

4. The package structure according to claim 1, wherein the plurality of antenna patterns comprises a plurality of antenna stripes and a plurality of antenna blocks, and the plurality of trenches is located on a surface of the antenna patterns at positions where the plurality of antenna stripes is joining the plurality of antenna blocks.

5. The package structure according to claim 1, wherein a ratio of a depth of the plurality of trenches to a thickness of the plurality of antenna pattern is in a range of 1:5 to 1:20.

6. The package structure according to claim 1, further comprising a backside redistribution layer located on the backside surface of the semiconductor die, wherein the backside redistribution layer is located in between the plurality of antenna patterns and the semiconductor die.

7. The package structure according to claim 6, wherein the backside redistribution layer comprises a plurality of trenches located on a surface of the backside redistribution layer.

8. A package structure, comprising:
at least one semiconductor die;
an insulating encapsulant encapsulating the at least one semiconductor die, wherein the insulating encapsulant has a first surface and a second surface opposite to the first surface;
a redistribution layer located on the first surface of the insulating encapsulant;
a backside redistribution layer located on the second surface of the insulating encapsulant; and
antenna patterns comprising:
a plurality of antenna stripes located over the redistribution layer or over the backside redistribution layer; and
a plurality of recessed antenna portions located over the redistribution layer or over the backside redistribution layer and joining the plurality of antenna stripes together, wherein a height of the plurality of recessed antenna portions is smaller than a thickness of the plurality of antenna stripes, and a length of the plurality of recessed antenna portions is equal to a width of the plurality of antenna stripes.

9. The package structure according to claim 8, further comprising a plurality of antenna blocks located over the backside redistribution layer, wherein the plurality of recessed antenna portions joins the plurality of antenna blocks to the plurality of antenna stripes.

10. The package structure according to claim 8, further comprising:
second antenna patterns located over the antenna patterns; and
a second insulating encapsulant located in between the second antenna patterns and the antenna patterns.

11. The package structure according to claim 10, wherein the second antenna patterns comprise:
a plurality of second antenna stripes located over the second insulating encapsulant; and
a plurality of second recessed antenna portions located over the second insulating encapsulant and joining the plurality of second antenna stripes together, wherein a height of the plurality of second recessed antenna portions is smaller than a thickness of the plurality of second antenna stripes, and a length of the plurality of second recessed antenna portions is equal to a width of the plurality of second antenna stripes.

12. The package structure according to claim 8, wherein the backside redistribution layer comprises a plurality of conductive layers and a plurality of trenches located on a surface of the plurality of conductive layers, and a width of the plurality of conductive layers is substantially equal to a length of the plurality of trenches.

13. The package structure according to claim 8, wherein the plurality of recessed antenna portions is joining the plurality of antenna stripes together at turning points of the plurality of antenna stripes.

14. The package structure according to claim 8, wherein a height variation between the plurality of antenna stripes and the plurality of recessed antenna portions is less than 5 µm.

15. A method of fabricating a package structure, comprising:
forming a backside redistribution layer on a carrier;
bonding at least one semiconductor die on the backside redistribution layer;
forming an insulating encapsulant encapsulating the at least one semiconductor die;
forming a top redistribution layer over the insulating encapsulant;
de-bonding the carrier to reveal a backside surface of the backside redistribution layer; and
forming a plurality of antenna patterns over the top redistribution layer or over the backside redistribution layer, wherein the plurality of antenna patterns is formed with a plurality of trenches located on a surface of the plurality of antenna patterns.

16. The method of fabricating the package structure according to claim 15, wherein the steps of forming the plurality of antenna patterns over the backside redistribution layer comprises:
providing a stencil over the backside redistribution layer, wherein the stencil has a plurality of aperture patterns and a plurality of bridge structures separating the plurality of aperture patterns;
pasting conductive materials into the plurality of aperture patterns;
removing the stencil so that adjacent conductive materials separated by the plurality of bridge structures will merge towards one another; and
curing the conductive materials to form the plurality of antenna patterns having the plurality of trenches.

17. The method of fabricating the package structure according to claim 16, wherein the plurality of antenna patterns is formed with a plurality of antenna stripes and a plurality of recessed antenna portions, and the plurality of recessed antenna portions is formed by the merging of the conductive materials at a position corresponding to the plurality of bridge structures.

18. The method of fabricating the package structure according to claim 17, wherein the plurality of antenna patterns is further formed with a plurality of antenna blocks, wherein the plurality of recessed antenna portions joins the plurality of antenna blocks to the plurality of antenna stripes.

19. The method of fabricating the package structure according to claim 15, wherein the backside redistribution layer is formed with a plurality of trenches located on a surface of the plurality of the backside redistribution layer.

20. The method of fabricating the package structure according to claim 15, further comprising forming a plurality of second antenna patterns over the antenna patterns, wherein the plurality of second antenna patterns is formed with a plurality of trenches located on a surface of the plurality of second antenna patterns.

* * * * *